(12) United States Patent
Cheng et al.

(10) Patent No.: US 10,665,505 B2
(45) Date of Patent: May 26, 2020

(54) SELF-ALIGNED GATE CONTACT ISOLATION

(71) Applicant: International Business Machines Corporation, Armonk, NY (US)

(72) Inventors: Kangguo Cheng, Schenectady, NY (US); Peng Xu, Santa Clara, CA (US); Ekmini A. De Silva, Slingerlands, NY (US); Ruilong Xie, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 11 days.

(21) Appl. No.: 15/986,645

(22) Filed: May 22, 2018

(65) Prior Publication Data

US 2019/0363015 A1  Nov. 28, 2019

(51) Int. Cl.
| | |
|---|---|
| *H01L 21/768* | (2006.01) |
| *H01L 23/485* | (2006.01) |
| *H01L 21/8234* | (2006.01) |
| *H01L 21/8238* | (2006.01) |
| *G06F 30/39* | (2020.01) |

(52) U.S. Cl.
CPC ........ *H01L 21/76897* (2013.01); *G06F 30/39* (2020.01); *H01L 21/76816* (2013.01); *H01L 21/823475* (2013.01); *H01L 21/823871* (2013.01); *H01L 23/485* (2013.01)

(58) Field of Classification Search
CPC ..... H01L 21/823475; H01L 21/823871; H01L 21/76897
USPC .......................................... 257/401; 438/142
See application file for complete search history.

(56) References Cited

U.S. PATENT DOCUMENTS

| | | | |
|---|---|---|---|
| 8,232,607 B2 | 7/2012 | Edge et al. | |
| 9,508,825 B1 * | 11/2016 | Basker | ................... H01L 29/665 |
| 9,620,622 B2 | 4/2017 | Farmer et al. | |
| 9,824,921 B1 | 11/2017 | Labonte et al. | |
| 2015/0137273 A1 | 5/2015 | Zhang et al. | |
| 2017/0040218 A1 | 2/2017 | Bohr et al. | |
| 2017/0054004 A1 * | 2/2017 | Cheng | ............... H01L 29/66553 |
| 2017/0373161 A1 * | 12/2017 | Schroeder | ......... H01L 29/41791 |
| 2018/0122919 A1 * | 5/2018 | Park | ................... H01L 29/66545 |
| 2019/0012422 A1 * | 1/2019 | Nayyar | ............... G06F 17/5077 |

* cited by examiner

*Primary Examiner* — Steven H Loke
*Assistant Examiner* — Brandon C Fox
(74) *Attorney, Agent, or Firm* — Garg Law Firm, PLLC; Rakesh Garg; Joseph Petrokaitis

(57) ABSTRACT

A semiconductor device includes a first contact positioned on an externally accessible surface of the semiconductor device and electrically coupled with a first structure in the semiconductor device, a second contact positioned on an externally accessible surface and electrically coupled with a second structure in the semiconductor device, and an isolation structure disposed between the first contact and the second contact, the isolation structure self-aligning with a first surface of the first contact such that the first surface of the first contact is orthogonal to the externally accessible surface up to a depth and faces the second contact.

17 Claims, 12 Drawing Sheets

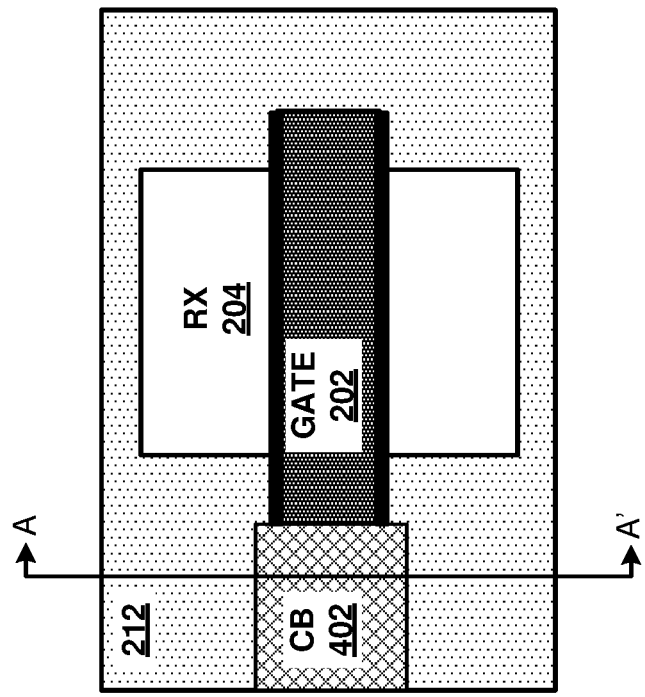
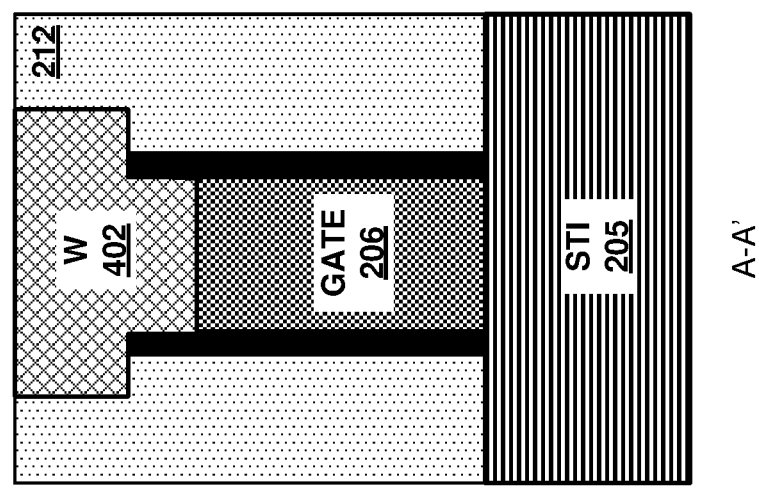
*FIGURE 4*

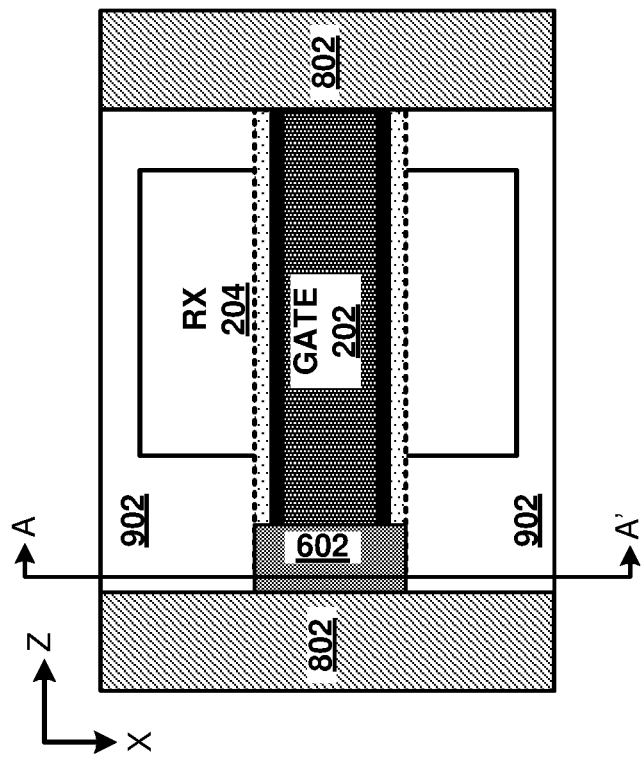
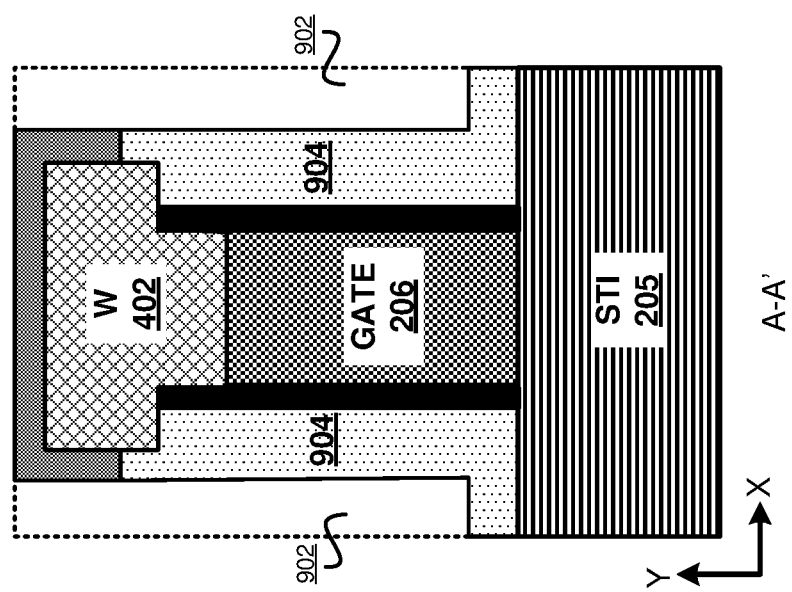
*FIGURE 9*

SELF-ALIGNED GATE CONTACT ISOLATION

TECHNICAL FIELD

The present invention relates generally to a method, system, and computer program product for fabricating semiconductor devices having multiple electrical contact points in close proximity with one another on a shared surface. More particularly, the present invention relates to a method, system, and computer program product for self-aligned gate contact isolation.

BACKGROUND

A Field Effect Transistor (FET) is a semiconductor device that controls the electrical conductivity between a source of electric current (source) and a destination of the electrical current (drain). The FET uses a semiconductor structure called a "gate" to create an electric field, which controls the shape and consequently the electrical conductivity of a channel between the source and the drain. The channel is a charge carrier pathway constructed using a semiconductor material.

Many semiconductor devices are planar, i.e., where the semiconductor structures are fabricated on one plane. A non-planar device is a three-dimensional (3D) device where some of the structures are formed above or below a given plane of fabrication.

A "contact" is an electrically conductive structure formed on an externally accessible surface of a semiconductor device. The semiconductor device, such as an FET, can be electrically connected into a circuit via the contacts. A contact of a semiconductor device electrically couples to one or more structures, generally a single structure, within the semiconductor device. Regardless of the planar or non-planar nature of a semiconductor device, such as the FET, various electrical contacts are generally formed or positioned on a single externally accessible surface of the device for the ease of connecting the device in a circuit. For example, in a transistor device, one contact (CB contact) connects to the gate structure in the device, one contact (a CA contact) connects to the source structure in the device, and one contact (another CA contact) connects to the drain structure in the device. Depending on the type of the transistor, additional contacts may be available, e.g., a contact (a TS contact) connecting to the fin in a finFET.

For the purposes of the illustrative embodiments, the orientation of the device is described in a three-dimensional space using X, Y, and Z coordinate system. The plane of fabrication is assumed to be the X-Z plane, with vertical structures above the fabrication plane extending in +Y direction and the vertical structures below the fabrication plane extending in −Y direction. This example orientation is not intended to be limiting. From this disclosure, those of ordinary skill in the art will be able to conceive other orientations of semiconductor devices in which an embodiment described herein can be adapted, and such alternate orientations and adaptations are contemplated within the scope of the illustrative embodiments.

SUMMARY

The illustrative embodiments provide a method, system, and computer program product. An embodiment includes a fabrication method that forms a first contact positioned on an externally accessible surface of the semiconductor device and electrically coupled with a first structure in the semiconductor device. The embodiment forms a second contact positioned on an externally accessible surface and electrically coupled with a second structure in the semiconductor device. The embodiment forms an isolation structure disposed between the first contact and the second contact, the isolation structure self-aligning with a first surface of the first contact, wherein the first surface of the first contact is orthogonal to the externally accessible surface up to a depth and faces the second contact.

An embodiment includes a semiconductor fabrication system. The embodiment includes a processor, a computer-readable memory, and a computer-readable storage device, and program instructions stored on the storage device for execution by the processors via the memories, the stored program instructions causing the fabrication system to perform operations of the fabrication method.

An embodiment includes a semiconductor device. The semiconductor device includes structures formed according to the fabrication method.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of the illustrative embodiments when read in conjunction with the accompanying drawings, wherein:

FIG. 4 depicts a block diagram of a contact forming step in the fabrication of a device according to an illustrative embodiment;

FIG. 9 depicts a block diagram of an etching step in the fabrication of a device according to an illustrative embodiment;

DETAILED DESCRIPTION

Figure 1:
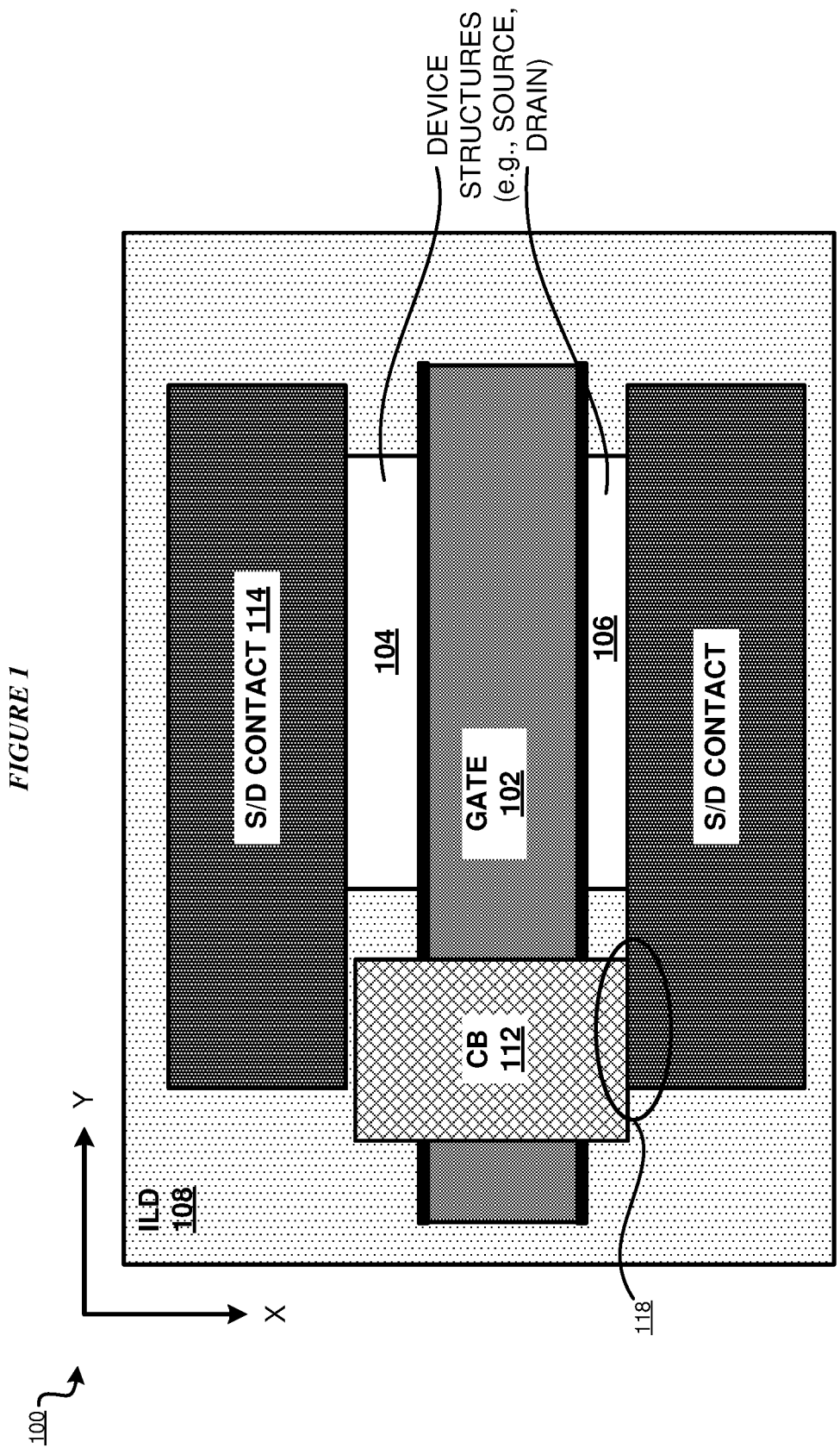
FIG. 1 depicts an example device fabrication highlighting a problem recognized by an illustrative embodiment.

The illustrative embodiments recognize that forming contacts adjacent to one another on a common externally accessible surface causes electrical short-circuit between two adjacent contacts, such as between a gate contact and a source/drain contact. Such short-circuits can render the device entirely non-functional or at least diminish the device's functions. Therefore, a need exists for a fabricating process to fabricate contacts of a device in such a way that the contacts are still positioned adjacent to one another on a common externally accessible surface but are electrically isolated from one another by isolation structures.

The illustrative embodiments used to describe the invention generally address and solve the above-described needs and other problems related to fabricating a self-aligned gate contact isolation. The illustrative embodiments provide a fabrication method for self-aligned gate contact isolation.

An embodiment comprises a semiconductor device described herein. Another embodiment comprises a fabrication process for the contemplated semiconductor device and can be implemented as a software application. The software application implementing an embodiment can be configured as a modification of an existing semiconductor fabrication system—such as a photolithography system, as a separate application that operates in conjunction with an existing semiconductor fabrication system, a standalone application, or some combination thereof. For example, the application causes the semiconductor fabrication system to perform the steps described herein, to fabricate a self-aligned gate contact isolation, as described herein.

For the clarity of the description, and without implying any limitation thereto, the illustrative embodiments are described using a specific type of semiconductor device, e.g., a transistor and specifically an FET. Within the scope of the illustrative embodiments, an embodiment can be implemented with a variety of similarly purposed elements, where such elements pose similar short-circuit problems as are recognized with the example transistor.

Furthermore, simplified diagrams of the example structures, elements, and device(s) are used in the figures and the illustrative embodiments. In an actual fabrication of a proposed device, additional structures that are not shown or described herein, or structures different from those shown and described herein, may be present without departing the scope of the illustrative embodiments. Similarly, within the scope of the illustrative embodiments, a shown or described structure in the example device may be fabricated differently to yield a similar operation or result as described herein.

Differently shaded portions in the two-dimensional drawing of the example structures, layers, and formations are intended to represent different structures, layers, and formations in the example fabrication, as described herein. The different structures, layers, and formations may be fabricated using suitable materials that are known to those of ordinary skill in the art as belonging to the same class of materials described herein.

A specific shape, location, position, or dimension of a shape depicted herein is not intended to be limiting on the illustrative embodiments unless such a characteristic is expressly described as a feature of an embodiment. The shape, location, position, dimension, or some combination thereof, are chosen only for the clarity of the drawings and the description and may have been exaggerated, minimized, or otherwise changed from actual shape, location, position, or dimension that might be used in actual photolithography to achieve an objective according to the illustrative embodiments.

Furthermore, the illustrative embodiments are described with respect to a specific actual or hypothetical semiconductor device only as an example. The steps described by the various illustrative embodiments can be adapted for fabricating a variety of planar and non-planar devices in a similar manner, and such adaptations are contemplated within the scope of the illustrative embodiments. The specific placements of contact isolation structures are also used only as non-limiting examples to describe certain options possible with the illustrative embodiments. Those of ordinary skill in the art will be able to use an embodiment to similarly provide contact isolation in a similar manner, and such usage is also contemplated within the scope of the illustrative embodiments.

An embodiment when implemented in an application causes a fabrication process to perform certain steps as described herein. The steps of the fabrication process are depicted in the several figures. Not all steps may be necessary in a particular fabrication process. Some fabrication processes may implement the steps in different order, combine certain steps, remove or replace certain steps, or perform some combination of these and other manipulations of steps, without departing the scope of the illustrative embodiments.

A device of an embodiment described herein, comprises substantial advancement of the semiconductor device fabrication technology. A manner of isolating contacts through the formation of contact isolation structures as described herein is unavailable in the presently available methods. Thus, a substantial advancement of such devices or data processing systems by executing a method of an embodiment is in an improved fabrication process for fabricating a set of contacts together with fabricating contact isolation structures relative to one or more contacts during device fabrication.

The illustrative embodiments are described with respect to certain types of devices, electrical properties, structures, formations, layers, orientations, directions, steps, operations, planes, materials, dimensions, numerosity, data processing systems, environments, components, and applications only as examples. Any specific manifestations of these and other similar artifacts are not intended to be limiting to the invention. Any suitable manifestation of these and other similar artifacts can be selected within the scope of the illustrative embodiments.

The illustrative embodiments are described using specific code, designs, architectures, protocols, layouts, schematics, and tools only as examples and are not limiting to the illustrative embodiments. Furthermore, the illustrative embodiments are described in some instances using particular software, tools, and data processing environments only as an example for the clarity of the description. The illustrative embodiments may be used in conjunction with other comparable or similarly purposed structures, systems, applications, or architectures.

The examples in this disclosure are used only for the clarity of the description and are not limiting to the illustrative embodiments. Additional structures, operations, actions, tasks, activities, and manipulations will be conceivable from this disclosure and the same are contemplated within the scope of the illustrative embodiments.

Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed above.

With reference to FIG. 1, this figure depicts an example device fabrication highlighting a problem recognized by an illustrative embodiment. This figure depicts a top-view of device 100, i.e., a view of the X-Z plane with structures fabricated along +Y axis, as viewed from above the structures.

Example device 100 includes gate 102 and other device structures, such as source/drain (S/D) 104 and source/drain 106. Inter-layer dielectric (ILD) 108 is a dielectric material that encapsulates the various structures of device 100. The top surface of ILD 108 forms the externally accessible surface of device 100 through which a set of contacts of device 100 are exposed for electrical connections to an external circuit. Contact 112 is a gate contact, e.g., a CB contact. Contacts 114 and 116 are contacts to other structures in device 100, such as CA contacts.

As shown in this figure, contact 112 is separated from contact 114 by some distance such that ILD material 108 occupies that space and provides electrical separation between contacts 112 and 114. However, contact 112 is not separated from contact 116 during fabrication, ILD material 108 is unable to electrically separate contacts 112 and 116, resulting in electrical short-circuit 118 between contacts 112 and 116.

Figure 2:
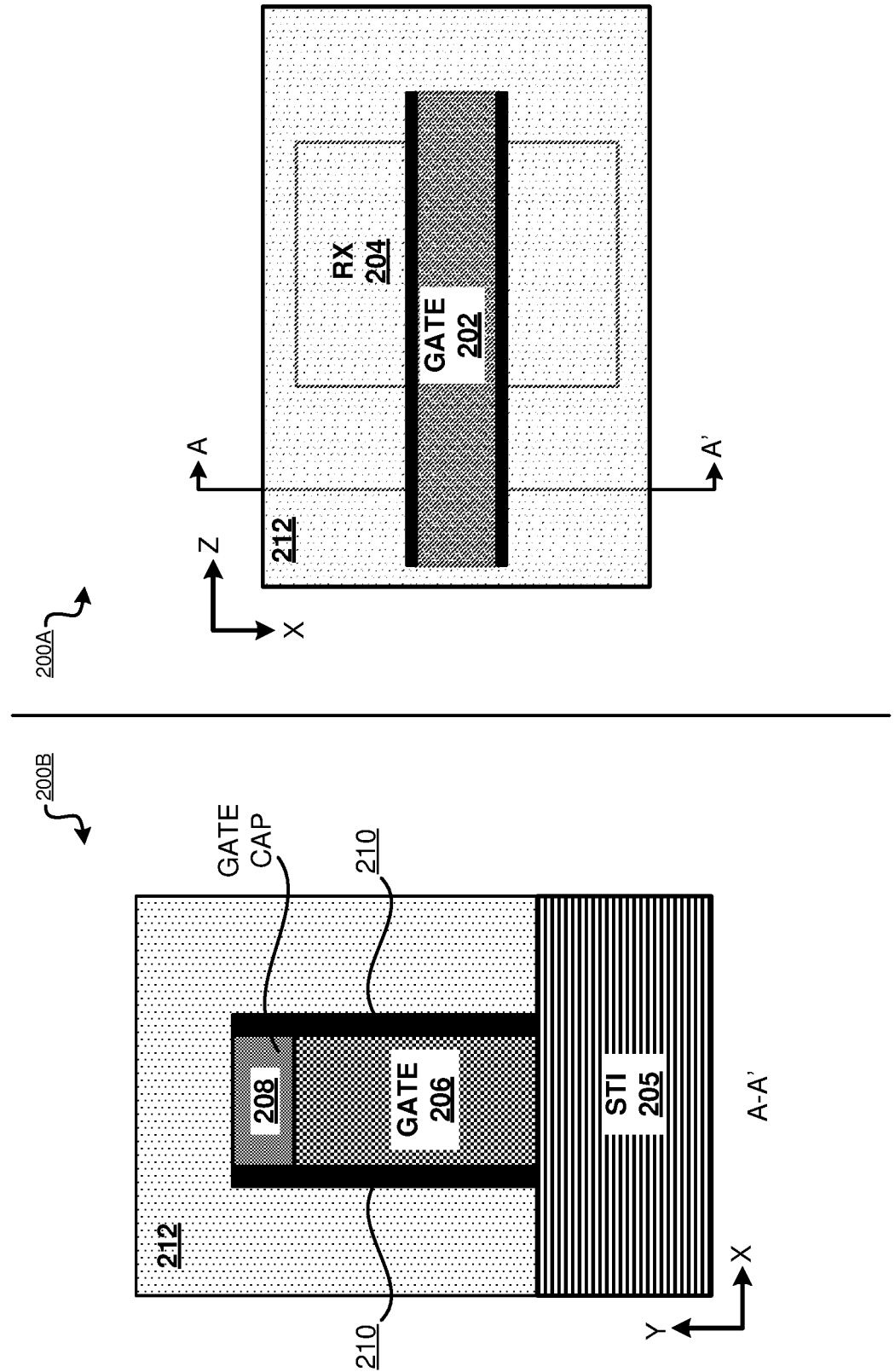
FIG. 2 depicts a block diagram of an initial step in the fabrication of a device according to an illustrative embodiment.

With reference to FIG. 2, this figure depicts a block diagram of an initial step in the fabrication of a device according to an illustrative embodiment. View 200A is a top view along X-Z plane of an example device being fabricated. View 200B is a front view along section line A-A' shown in view 200A. View 200B shows the X-Y plane in the direction of section line A-A'.

Assume that the device being fabricated is a transistor. In view 200A, gate structure 202 operates in the manner of gate 102 in FIG. 1. Remaining structures of the device are represented by block (RX) 204.

Structures 204 and gate structure 202 are fabricated using substrate 205 shown in view 200B. View 200B shows gate structure 202 comprising gate 206 and gate cap 208. Structures 204 include spacers 210 and other structures, such as S/D structures that are occluded in view 200B by ILD 212. ILD 212 is an example of ILD 108 in FIG. 1.

Substrate 205 contemplated within the scope of the illustrative embodiments can be formed using any suitable substrate material, such as, for example, monocrystalline Silicon (Si), Silicon-Germanium (SiGe), Silicon-Carbon (SiC), compound semiconductors obtained by combining group III elements from the periodic table (e.g., Al, Ga, In) with group V elements from the periodic table (e.g., N, P, As, Sb) (III-V compound semiconductor), compounds obtained by combining a metal from either group 2 or 12 of the periodic table and a nonmetal from group 16 (the chalcogens, formerly called group VI) (II-VI compound semiconductor), or semiconductor-on-insulator (SOI). In some embodiments of the invention, the substrate includes a buried oxide layer (not depicted). Fins (not shown) are semiconductor structures that are formed using the same material or different materials from the substrate.

Source and drain structures are formed on the opposite sides of a gate, such as gate 206. An S/D structure is offset or separated from the gate by one or more gate spacers, such as spacers 210. In one example embodiment, source and drain structures are formed from an in-situ doped (i.e., during growth) epitaxial material such as in-situ doped epitaxial Si, carbon doped silicon (Si:C) and/or SiGe. Suitable n-type dopants include but are not limited to phosphorous (P), and suitable p-type dopants include but are not limited to Boron (B). The use of an in-situ doping process is merely an example. For instance, an ex-situ process can be used instead of the in-situ process to introduce dopants into the source and drain structures. Other doping techniques include but are not limited to, ion implantation after the bottom source/drain are formed. Dopant techniques include but are not limited to, ion implantation, gas phase doping, plasma doping, plasma immersion ion implantation, cluster doping, infusion doping, liquid phase doping, solid phase doping, in-situ epitaxy growth, or any suitable combination of those techniques.

Gate spacers, such as spacers 210, are formed using a suitable spacer material. Some examples of the spacer material include, but are not limited to, Silicon nitride (SiN), Silicon carbide (SiC), Carbon-doped Silicon oxide (SiOC), Silicon-carbon-nitride (SiCN), Boron nitride (BN), Silicon Boron nitride (SiBN), Silicoboron carbonitride (SiBCN), Silicon oxycabonitride (SiOCN), Silicon oxynitride (SiON), and combinations thereof. The spacer material also acts as a dielectric material. The dielectric material used as spacer material can be a suitable low-k (low dielectric constant) material, such as a material having a dielectric constant less than approximately 7, or preferably less than approximately 5.

Gate 206 comprises a gate dielectric and a gate conductor. Gate dielectric can comprise any suitable dielectric material, including but not limited to silicon oxide, silicon nitride, silicon oxynitride, other high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k gate dielectric material may further include dopants such as lanthanum, aluminum, magnesium. A gate structure of the gate dielectric material can be formed by any suitable process or any suitable combination of multiple processes, including but not limited to, thermal oxidation, chemical oxidation, thermal nitridation, plasma oxidation, plasma nitridation, atomic layer deposition (ALD), chemical vapor deposition (CVD), etc. In some embodiments, the gate dielectric has a thickness ranging from 1 nm to 5 nm, although less thickness and greater thickness are also contemplated.

The gate conductor can comprise any suitable conducting material, including but not limited to, doped polycrystalline or amorphous silicon, germanium, silicon germanium, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide ($RuO_2$), cobalt silicide (CoSi), nickel silicide (NiSi)), transition metal aluminides (e.g. $Ti_3Al$, ZrAl), TaC, TaMgC, carbon nanotube, conductive carbon, graphene, or any suitable combination of these materials. The conductive material may further comprise dopants that are incorporated during or after deposition. In some embodiments, the gate may further comprise a workfunction setting layer between the gate dielectric and gate conductor. The workfunction setting layer can be a workfunction metal (WFM). WFM can be any suitable material, including but not limited a nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof. In some embodiments, a conductive material or a combination of multiple conductive materials can serve as both gate conductor and WFM. The gate conductor and WFM can be formed by any suitable process or any suitable combination of multiple processes, including but not limited to, atomic layer deposition (ALD), chemical vapor deposition (CVD), physical vapor deposition (PVD), sputtering, plating, evaporation, ion beam deposition, electron beam deposition, laser assisted deposition, chemical solution deposition, etc.

Contacts, such as TS contact, CA/CB contacts are metallic contact. A metal contact can be formed or filled using, but is not limited to, tungsten (W), aluminum (Al), or copper (Cu), cobalt (Co), which can further include a barrier layer. The barrier layer can be, but is not limited to, titanium nitride (TiN), tantalum nitride (TaN), hafnium nitride (HfN), niobium nitride (NbN), tungsten nitride (WN), or combinations thereof, where the barrier layer can prevent diffusion and/or alloying of the metal contact fill material with the top source drain material, and/or anode/cathode material. In various embodiments, the barrier layer can be conformally deposited in the trench(es) by ALD, CVD, MOCVD, PECVD, or combinations thereof. In various embodiments, the metal fill can be formed by ALD, CVD, and/or PVD to form the electrical contacts.

Figure 3:
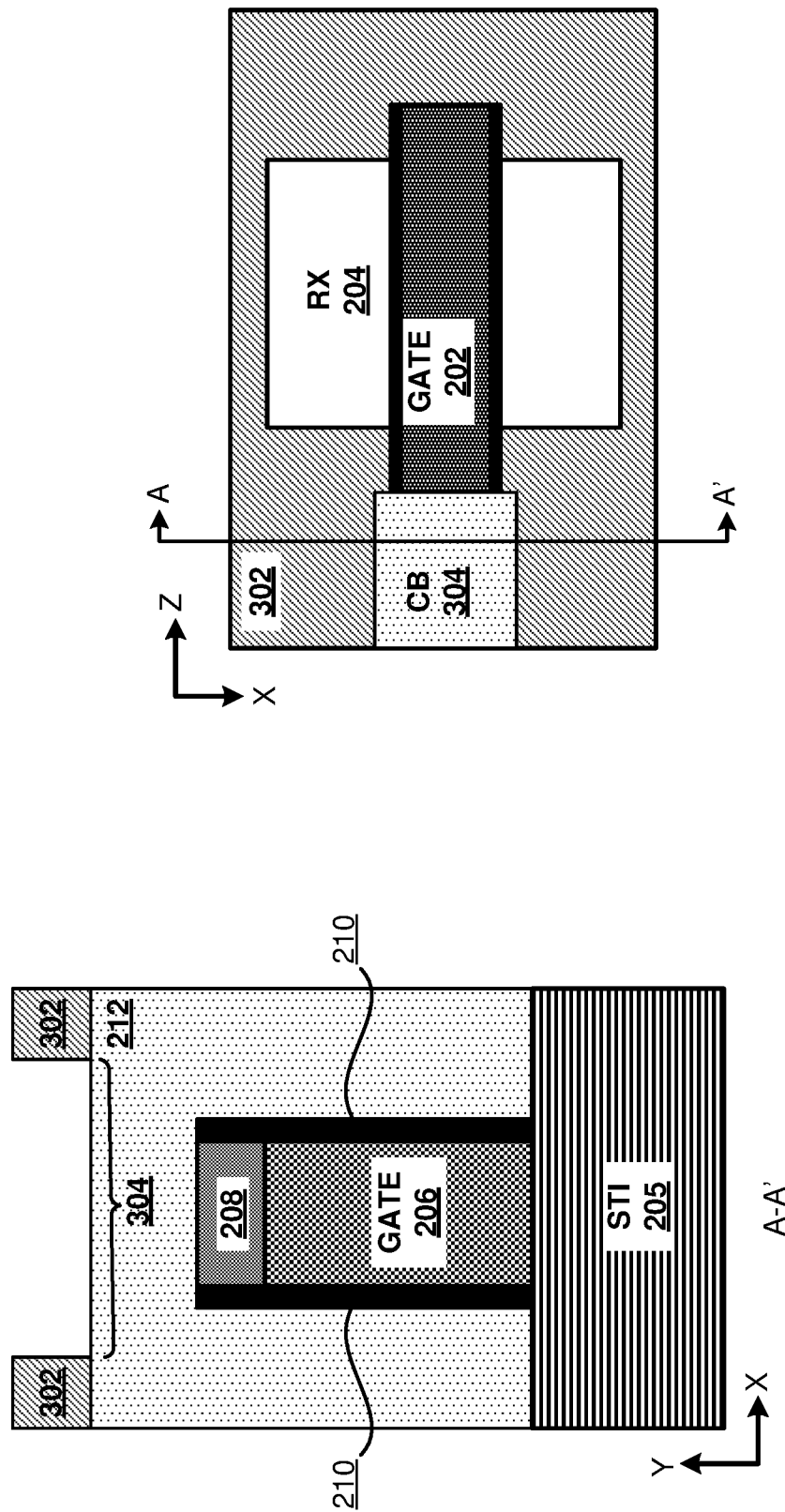
FIG. 3 depicts a block diagram of a masking step in the fabrication of a device according to an illustrative embodiment.

With reference to FIG. 3, this figure depicts a block diagram of a masking step in the fabrication of a device according to an illustrative embodiment. The top view and the front view are oriented similarly as described in FIG. 2.

Mask 302 is a gate contact mask, which is configured to cover substantially the entire device while leaving open region 304 where the CB gate contact will be formed. Mask 302 causes ILD 212 at region 304 to be etched while the rest of ILD 212 remains protected by mask 302. Mask 392 can be a photoresist mask or a sacrificial hard mask.

With reference to FIG. 4, this figure depicts a block diagram of a contact forming step in the fabrication of a device according to an illustrative embodiment. The top view and the front view are oriented similarly as described in FIG. 2.

An etching process, such as Reactive Ion Etching (REI) is performed using mask 302 of FIG. 3. The etching removes mask 302 exposing ILD 212, etches through and removes gate cap 208, and essentially etches region 304 down to gate 206 exposing gate 206 material for electrical connection. A suitable gate contact material such as Tungsten is filled in the recess formed by this etching process. The filled material forms gate contact 402. Gate contact 402 is in electrical connection with gate 206. Optionally, contact 402 is polished using a suitable process, such as chemical-mechanical planarization (CMP) to level the top surface of contact 402 with the surface of ILD 212.

Figure 5:
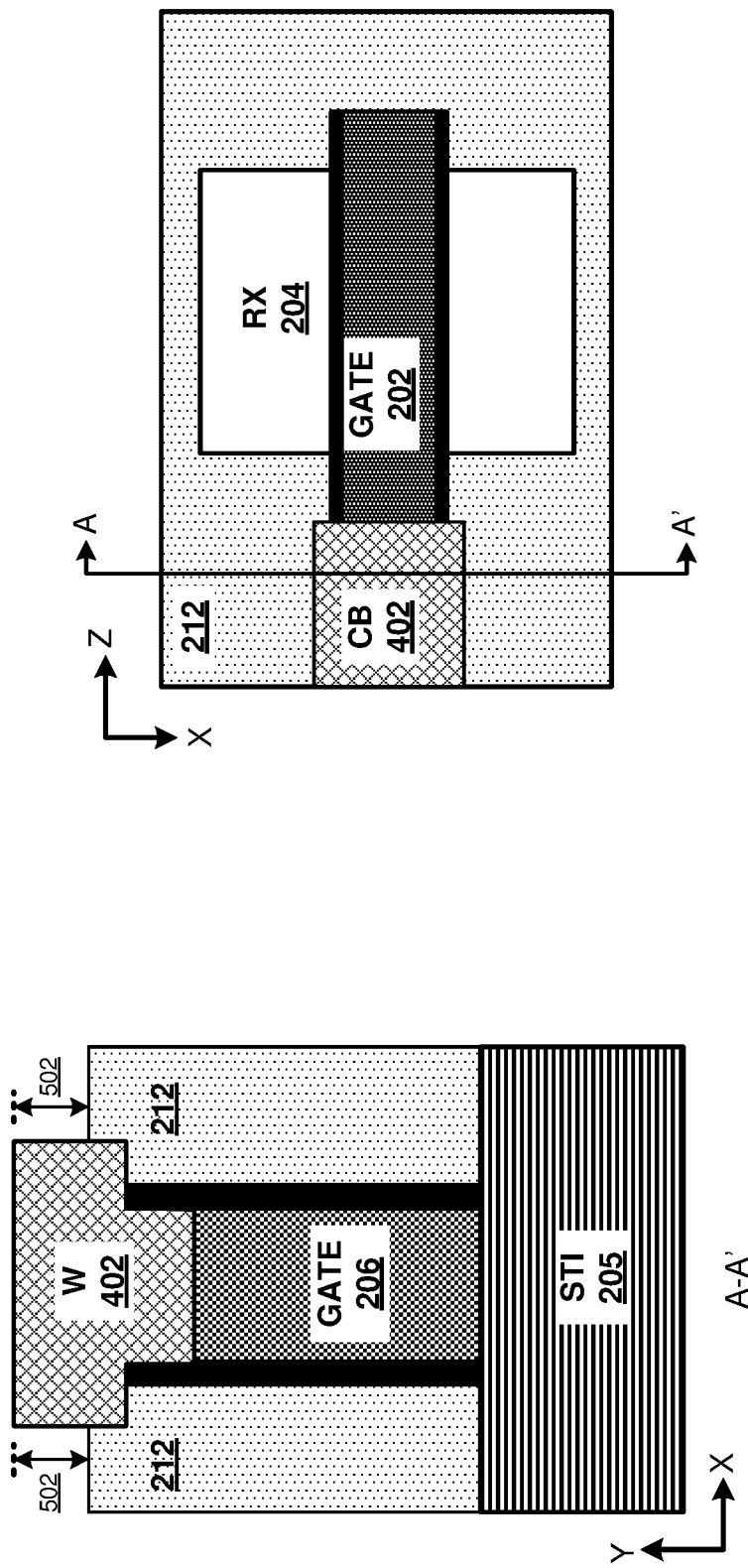
FIG. 5 depicts a block diagram of a recessing step in the fabrication of a device according to an illustrative embodiment.

With reference to FIG. 5, this figure depicts a block diagram of a recessing step in the fabrication of a device according to an illustrative embodiment. The top view and the front view are oriented similarly as described in FIG. 2.

An embodiment performs an etching process, such as REI, on ILD surface exposed by the removal of mask 302 in FIG. 3. The etching recesses ILD 212 to depth 502. Depth 502 reduces a level of ILD 212 to below the top surface of contact 402.

Figure 6:
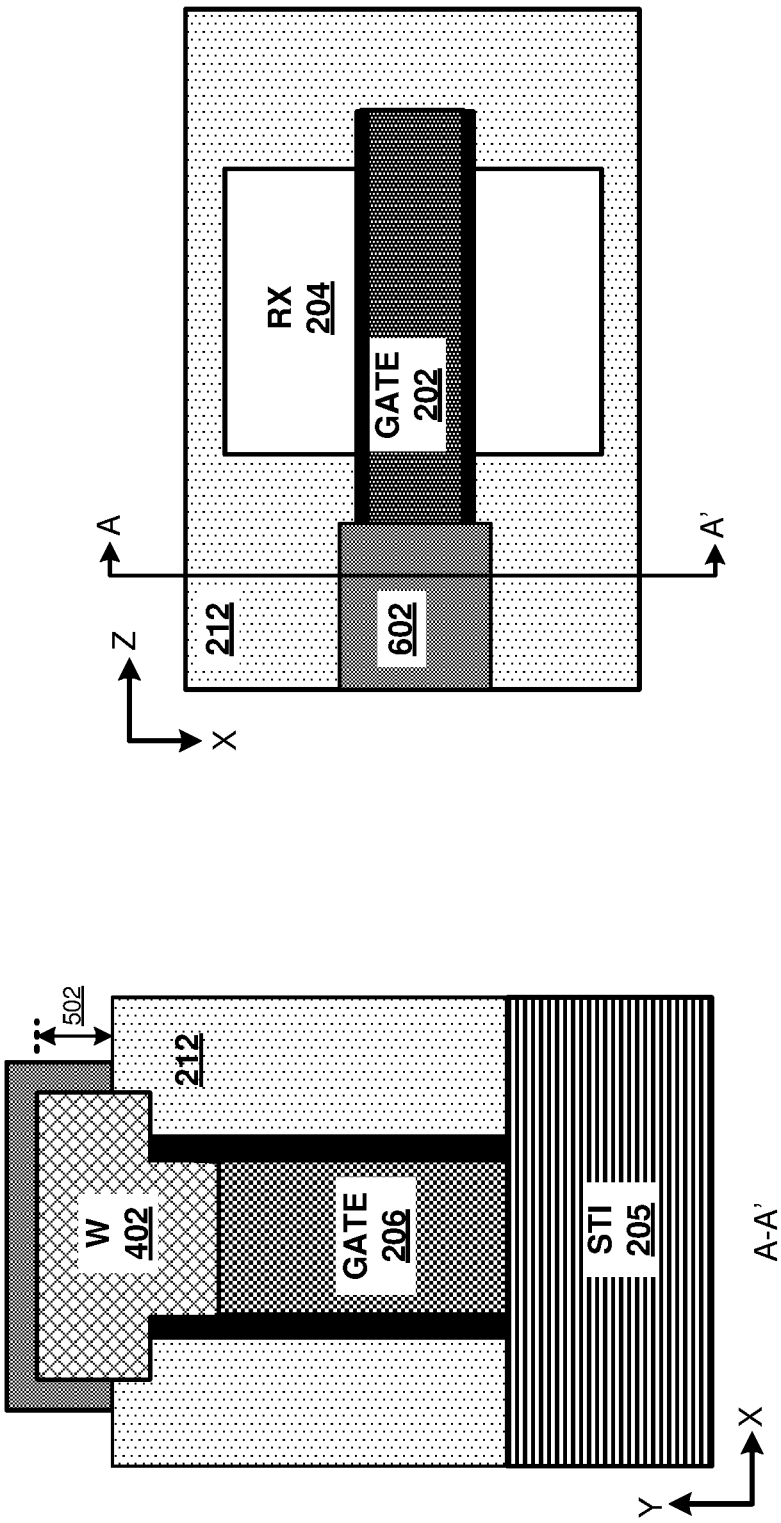
FIG. 6 depicts a block diagram of a capping step in the fabrication of a device according to an illustrative embodiment.

With reference to FIG. 6, this figure depicts a block diagram of a capping step in the fabrication of a device according to an illustrative embodiment. The top view and the front view are oriented similarly as described in FIG. 2.

An embodiment performs a selective cap deposition operation to form cap 602. The selective deposition process deposits the capping material, e.g., SiN, only on the metal of contact 402 and not on oxide or ILD 212. Cap 602 self-aligns with the surfaces of contact 402 and covers all surfaces of contact 402 that protrude from ILD 212 after the recessing in FIG. 5. Cap 602 operates as an electrical insulator.

Figure 7:
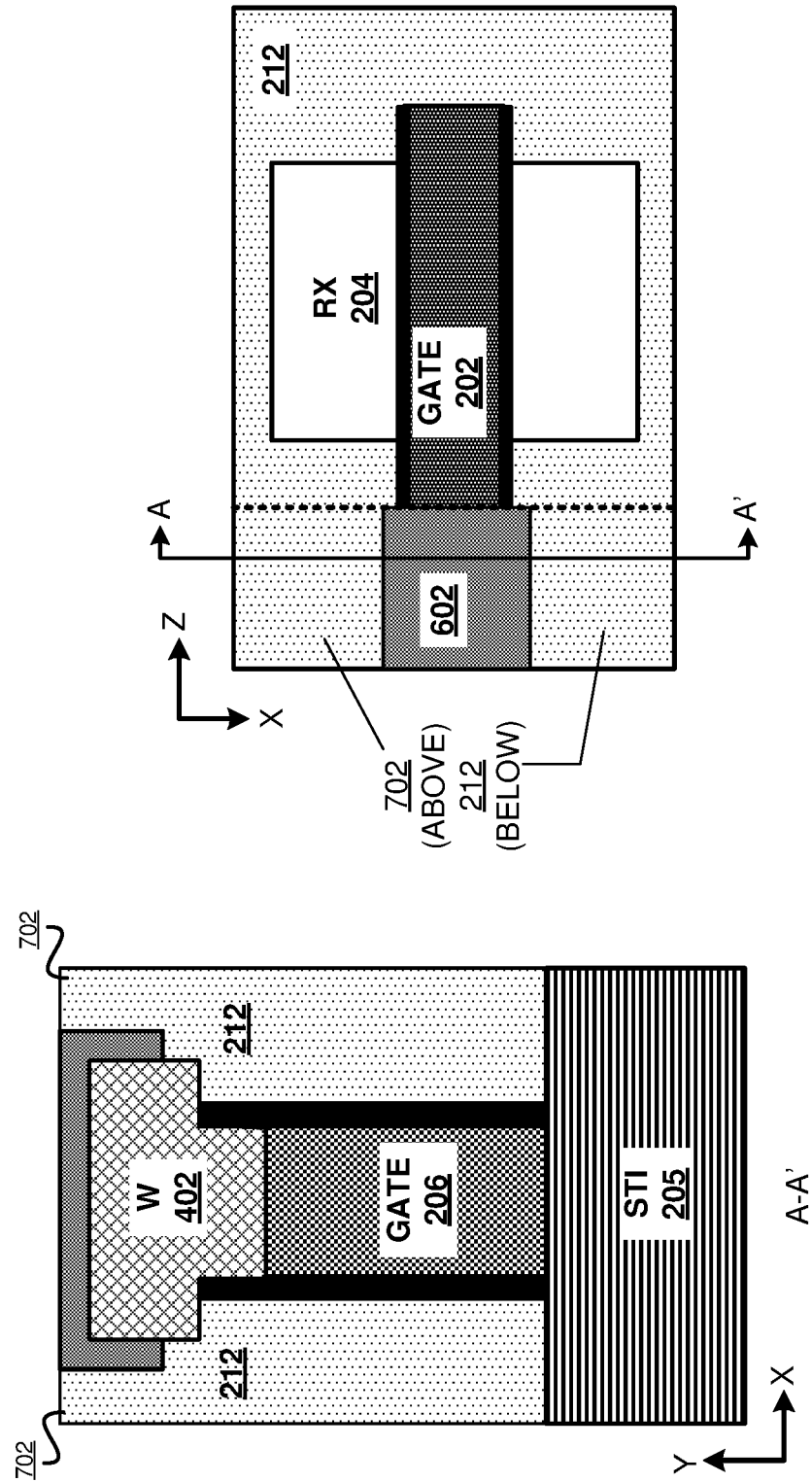
FIG. 7 depicts a block diagram of a filling step in the fabrication of a device according to an illustrative embodiment.

With reference to FIG. 7, this figure depicts a block diagram of a filling step in the fabrication of a device according to an illustrative embodiment. The top view and the front view are oriented similarly as described in FIG. 2.

Cap 602 partially occupies the recess created in FIG. 5. An embodiment performs a filling operation to fill the remainder of the recess created in FIG. 5 will fill material 702. As an example, fill material 702 can be a dielectric, such as silicon oxide. In one embodiment, fill material 702 is the same material as ILD 212. In another embodiment, fill material 702 is different from the material used as ILD 212.

Figure 8:
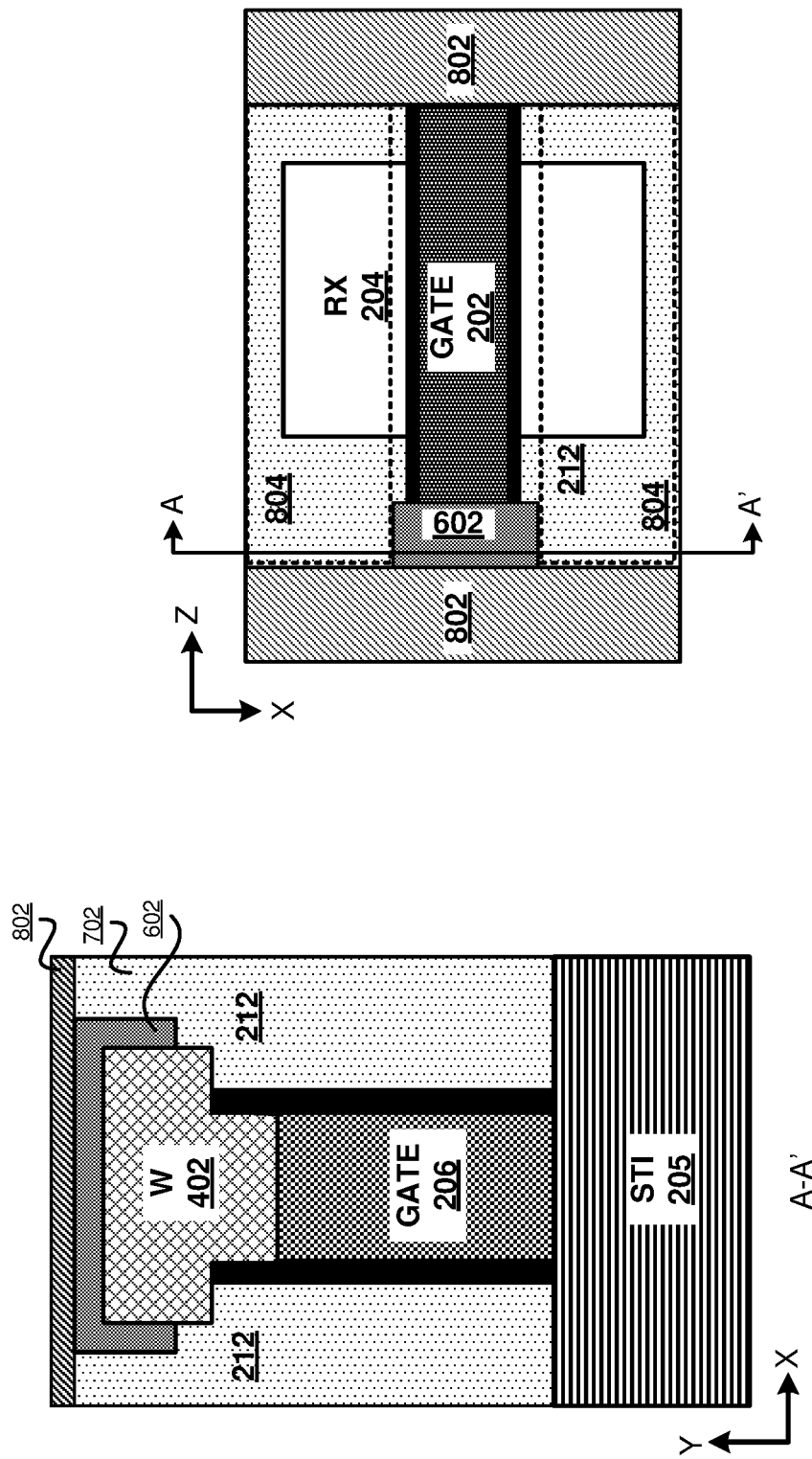
FIG. 8 depicts a block diagram of a masking step in the fabrication of a device according to an illustrative embodiment.

With reference to FIG. 8, this figure depicts a block diagram of a masking step in the fabrication of a device according to an illustrative embodiment. The top view and the front view are oriented similarly as described in FIG. 2.

Mask 802 is a contact mask, configured to leave open those areas where other contacts, such as the CA contacts for source/drain are to be formed, and covers the other portions of the top surface of the device. Mask 302 causes ILD 212 at regions 804 to be etched. Mask 392 can be a photoresist mask or a sacrificial hard mask.

With reference to FIG. 9, this figure depicts a block diagram of an etching step in the fabrication of a device according to an illustrative embodiment. The top view and the front view are oriented similarly as described in FIG. 2.

An etching process, such as REI is performed using mask 802 of FIG. 8. The etching removes mask 802, etches through ILD 212 to form contact trenches 902 in areas 804 that were left open by mask 802. Cap 602 remains intact and causes ILD 904 portion of ILD 212, which lies below cap 602 to also remain protected from the etching.

Figure 10:
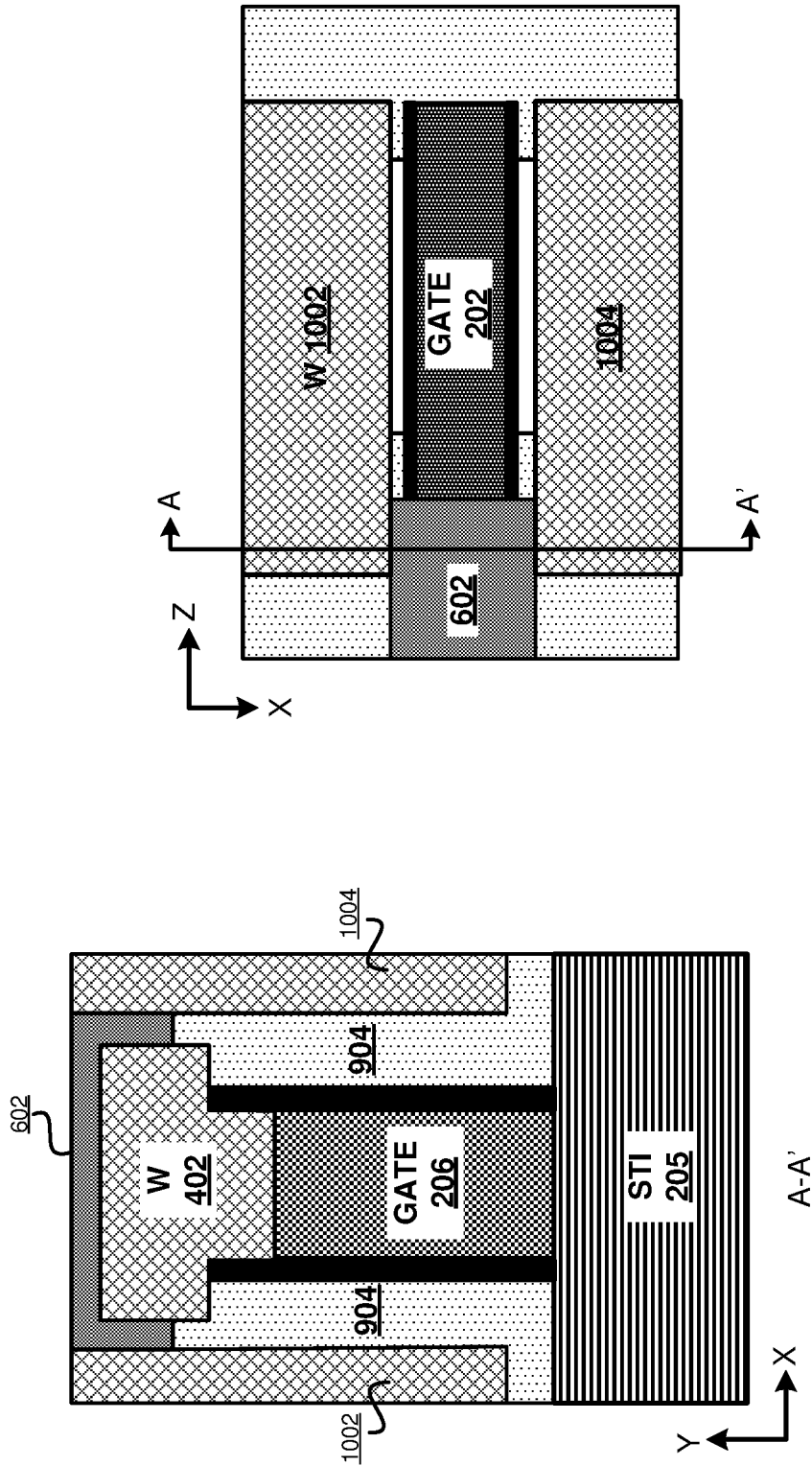
FIG. 10 depicts a block diagram of a contact forming step in the fabrication of a device according to an illustrative embodiment.

With reference to FIG. 10, this figure depicts a block diagram of a contact forming step in the fabrication of a device according to an illustrative embodiment. The top view and the front view are oriented similarly as described in FIG. 2.

A suitable source/drain contact material such as Tungsten is filled in trenches 902 formed by the etching process of FIG. 9. The filled material forms contact 1002, which is analogous to contact 114 in FIG. 1, and contact 1004, which is analogous to contact 116 in FIG. 1. Contacts 1002 and 1004 are in electrical connection with their respective S/D structures in device 204. Contacts 1002 and 1004 are level with the surface of cap 602 on the externally accessible surface. Optionally, contacts 1002 and 1004 are polished using a suitable process, such as CMP, to level the top surface of contacts 1002 and 1004 with cap 602.

Figure 11:
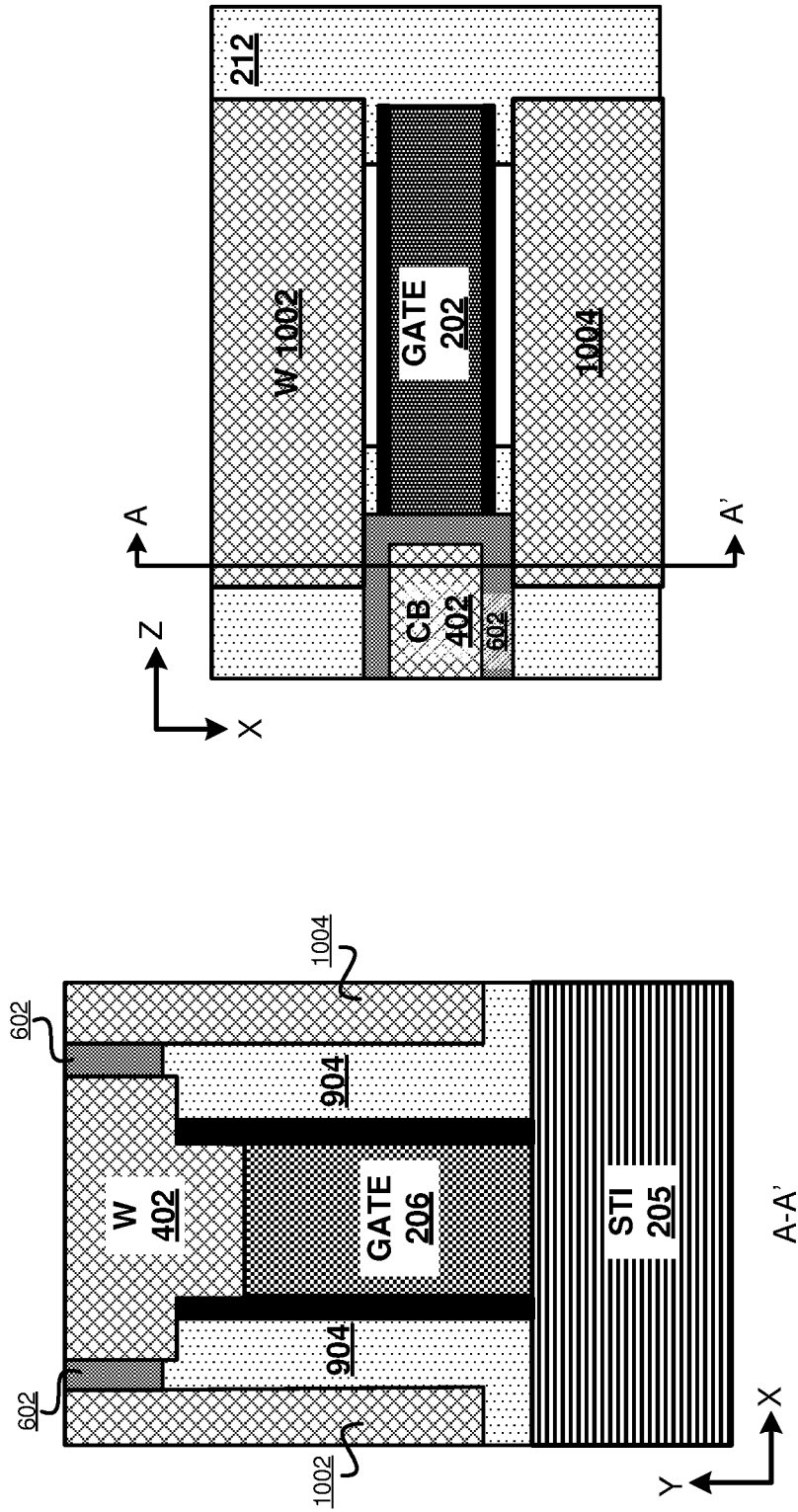
FIG. 11 depicts a block diagram of a contact exposing step in the fabrication of a device according to an illustrative embodiment.

With reference to FIG. 11, this figure depicts a block diagram of a contact exposing step in the fabrication of a device according to an illustrative embodiment. The top view and the front view are oriented similarly as described in FIG. 2.

A polishing or cap removal process, such as CMP, removes the opt portion of cap 602 to expose gate contact 402. Contacts 1002 and 1004 are also simultaneously polished to level the top surface of contacts 1002 and 1004 with gate contact 402.

As can be seen, portions of cap 602 remain self-aligned with the surfaces of gate contact 402 that face contacts 1002 and 1004. These portions of remaining gate cap 602 serve to electrically isolate gate contact 402 from contacts 1002 and 1004, preventing electrical short-circuit between gate contact 402, contact 1002, and contact 1004.

Figure 12:
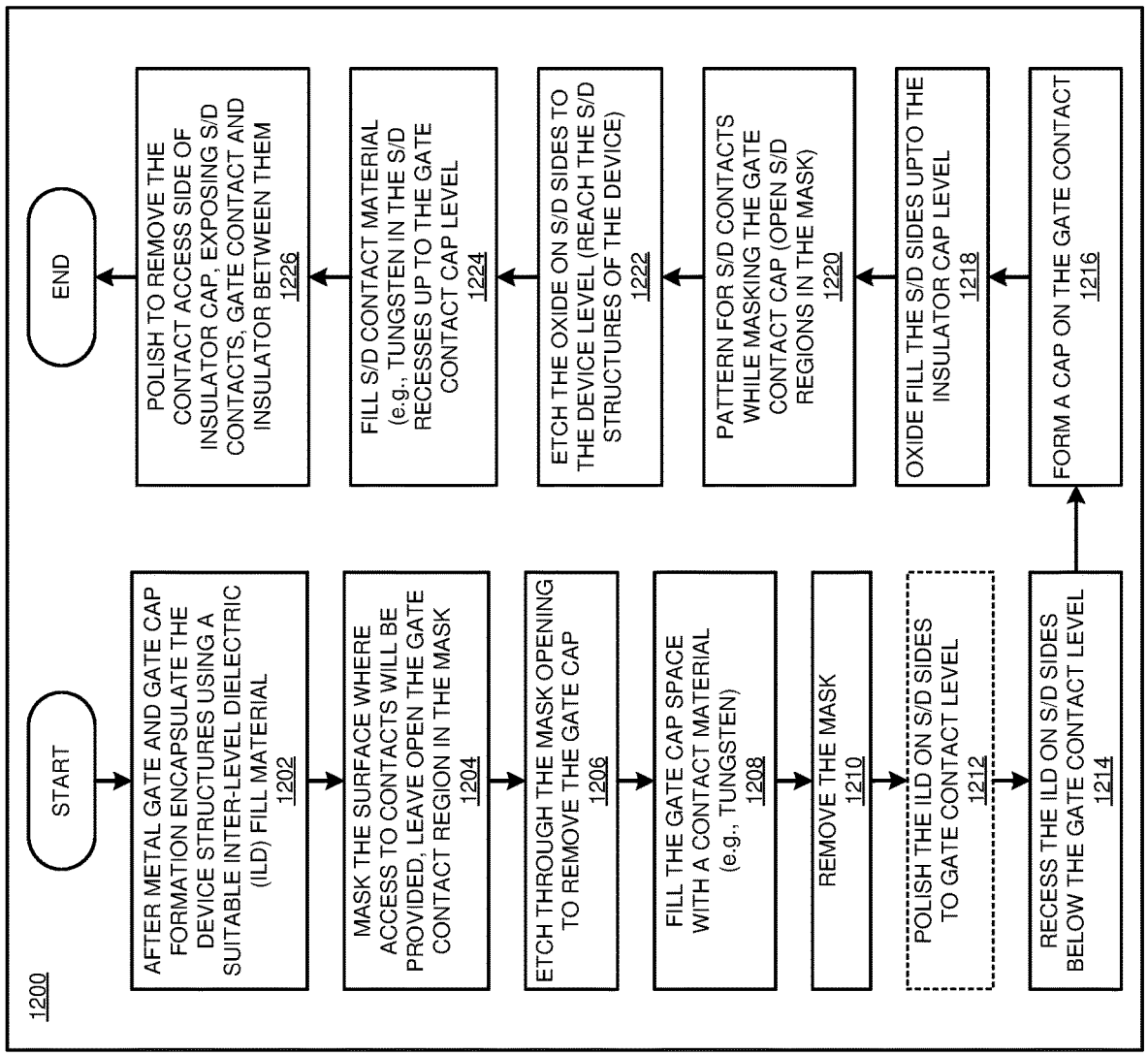
FIG. 12 depicts a flowchart of an example process for fabricating self-aligned gate contact isolation in semiconductor devices in accordance with an illustrative embodiment.

With reference to FIG. 12, this figure depicts a flowchart of an example process for fabricating self-aligned gate contact isolation in semiconductor devices in accordance with an illustrative embodiment. Process 1200 can be implemented in a software application that configures a fabrication system to perform the operations described herein.

After a metal gate and gate cap have been formed in a device, the application causes the fabrication system to encapsulate the device structures using a suitable ILD material (block 1202). The application causes the fabrication system to mask the surface where access to contacts will be provided, leaving open the gate contact region in the mask (block 1204). The application causes the fabrication system to etch through the mask opening to remove the gate cap (block 1206). The application causes the fabrication system to fill the gate cap space with a contact material (block 1208).

The application causes the fabrication system to remove the mask (block 1210). The application causes the fabrication system to optionally polish the ILD on the S/D sides of the gate to the gate contact level (block 1212).

The application causes the fabrication system to recess the ILD on the S/D sides below the gate contact level (block 1214). The application causes the fabrication system to form a protective cap on the gate contact (block 1216). The application causes the fabrication system to fill the S/D sides up to the insulator cap level with a suitable material, e.g., oxide (block 1218).

The application causes the fabrication system to pattern for S/D contacts while masking the gate contact protective cap (block 1220). The application causes the fabrication system to etch the oxide on the S/D sides up to the device level such that the etched trenches expose the S/D structures for electrical connections (block 1222). The application fills the trenches with a contact material (block 1224). The fill of the contact material is leveled with the top of the gate contact protective cap.

The application causes the fabrication system to polish the externally accessible surface such that the top portion of the gate contact cap is removed, the gate contact is exposed, and the S/D contacts are exposed and leveled with the gate contact (block 1226). The application ends process 1200 thereafter.

While certain steps and processes are described with certain structures, it is to be understood that the steps and/or processes can be adapted to fabricate any of the structure variations described herein within the scope of the illustrative embodiments. While certain materials are used in multiple layers or structures, it is to be understood that substitute materials or different but functionally equivalent materials can be used in place of the described materials at any layers described herein within the scope of the illustrative embodiments. While certain fabrication methods have been used at certain steps, it is to be understood that a fabrication method may be omitted, added, or modified at a described step to achieve functionally similar result from the semiconductor structure within the scope of the illustrative embodiments. While certain operations are described as a "step", several operations can be combined together to form a single fabrication step in a process described herein. While certain orientations have been referred to as "top" and "bottom" with reference to an example vertical orientation of the proposed device, it is to be understood that the device can be reoriented laterally such that the top and bottom become left/right or right/left, or bottom and top, or front/back or back/front, as the reorientation case may be.

Thus, a semiconductor device, fabrication method therefor, and a fabrication system or apparatus therefor using a software implementation of the method, are provided in the illustrative embodiments for self-aligned gate contact isolation and other related features, functions, or operations. Where an embodiment or a portion thereof is described with respect to a type of semiconductor device, the fabrication method, system or apparatus, the software implementation, or a portion thereof, are adaptable or configurable for use with a different manifestation of that type of device.

The present invention may be a semiconductor device, system, a method, and/or a computer program product at any possible technical detail level of integration. The computer program product may include a computer readable storage medium (or media) having computer readable program instructions thereon for causing a processor to carry out aspects of the present invention. A computer readable storage medium, including but not limited to computer-readable storage devices as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network.

What is claimed is:

1. A semiconductor device comprising:
   a first contact positioned on an externally accessible surface of the semiconductor device and electrically coupled with a first structure in the semiconductor device;
   a second contact positioned on an externally accessible surface and electrically coupled with a second structure in the semiconductor device;
   an isolation structure disposed between the first contact and the second contact, the isolation structure self-aligning with a first surface of the first contact, wherein the first surface of the first contact is orthogonal to the externally accessible surface up to a depth and faces the second contact; and
   a contact cap selectively covering all exposed surfaces of the first contact, the contact cap form being formed using an electrical insulator material.

2. The semiconductor device of claim 1, further comprising:
   a third contact positioned on the externally accessible surface and electrically coupled with a third structure in the semiconductor device; and the isolation structure extending to surround the first contact such that the isolation structure is further disposed between the first contact and the third contact, the isolation structure further self-aligning with a second surface of the first contact, wherein the second surface of the first contact is orthogonal to the externally accessible surface and faces the third contact.

3. The semiconductor device of claim 1, wherein the semiconductor device is a transistor, wherein the first structure is a gate of the transistor, and wherein the second structure is a structure usable as one of a source and a drain of the transistor.

4. A method comprising:
forming a first contact positioned on an externally accessible surface of the semiconductor device and electrically coupled with a first structure in the semiconductor device;
forming a second contact positioned on an externally accessible surface and electrically coupled with a second structure in the semiconductor device;
forming an isolation structure disposed between the first contact and the second contact, the isolation structure self-aligning with a first surface of the first contact, wherein the first surface of the first contact is orthogonal to the externally accessible surface up to a depth and faces the second contact;
forming a contact cap selectively covering all exposed surfaces of the first contact, the contact cap being formed using an electrical insulator material; and
modifying the contact cap to form the isolation structure.

5. The method of claim 4, further comprising:
forming a third contact positioned on the externally accessible surface and electrically coupled with a third structure in the semiconductor device; and
forming the isolation structure extending to surround the first contact such that the isolation structure is further disposed between the first contact and the third contact, the isolation structure further self-aligning with a second surface of the first contact, wherein the second surface of the first contact is orthogonal to the externally accessible surface and faces the third contact.

6. The method of claim 4, further comprising:
forming the first structure;
forming the second structure; and
encapsulating the first structure and the second structure using a dielectric material.

7. The method of claim 6, further comprising:
etching the dielectric material to make a portion of the first structure accessible or forming an electrical connection with the first contact.

8. The method of claim 4, further comprising:
etching a dielectric material surrounding the first contact to expose the first surface;
forming the self-aligning isolation structure along the exposed first surface; and
filling a second dielectric material such that the isolation structure is disposed between the first surface of the first contact and the second dielectric material.

9. The method of claim 8, further comprising:
recessing the second dielectric material and the dielectric material to form a trench such that the trench makes a portion of the second structure accessible or forming an electrical connection with the second contact.

10. The method of claim 4, wherein the semiconductor device is a transistor, wherein the first structure is a gate of the transistor, and wherein the second structure is a structure usable as one of a source and a drain of the transistor.

11. A semiconductor device fabrication system comprising a processor, a non-transitory computer-readable memories, and a non-transitory computer-readable storage device, and program instructions stored on the storage device for execution by the processors via the memories, the stored program instructions causing the fabrication system to perform operations comprising:
forming a first contact positioned on an externally accessible surface of the semiconductor device and electrically coupled with a first structure in the semiconductor device;
forming a second contact positioned on an externally accessible surface and electrically coupled with a second structure in the semiconductor device;
forming an isolation structure disposed between the first contact and the second contact, the isolation structure self-aligning with a first surface of the first contact, wherein the first surface of the first contact is orthogonal to the externally accessible surface up to a depth and faces the second contact;
forming a contact cap selectively covering all exposed surfaces of the first contact, the contact cap being formed using an electrical insulator material; and
modifying the contact cap to form the isolation structure.

12. The semiconductor device fabrication system of claim 11, further comprising:
forming a third contact positioned on the externally accessible surface and electrically coupled with a third structure in the semiconductor device; and
forming the isolation structure extending to surround the first contact such that the isolation structure is further disposed between the first contact and the third contact, the isolation structure further self-aligning with a second surface of the first contact, wherein the second surface of the first contact is orthogonal to the externally accessible surface and faces the third contact.

13. The semiconductor device fabrication system of claim 11, further comprising:
forming the first structure;
forming the second structure; and
encapsulating the first structure and the second structure using a dielectric material.

14. The semiconductor device fabrication system of claim 13, further comprising:
etching the dielectric material to make a portion of the first structure accessible or forming an electrical connection with the first contact.

15. The semiconductor device fabrication system of claim 11, further comprising:
etching a dielectric material surrounding the first contact to expose the first surface;
forming the self-aligning isolation structure along the exposed first surface; and
filling a second dielectric material such that the isolation structure is disposed between the first surface of the first contact and the second dielectric material.

16. The semiconductor device fabrication system of claim 15, further comprising:
recessing the second dielectric material and the dielectric material to form a trench such that the trench makes a portion of the second structure accessible or forming an electrical connection with the second contact.

17. The semiconductor device fabrication system of claim 11, wherein the semiconductor device is a transistor, wherein the first structure is a gate of the transistor, and wherein the second structure is a structure usable as one of a source and a drain of the transistor.

\* \* \* \* \*